(12) United States Patent
Shimizu

(10) Patent No.: US 11,275,419 B2
(45) Date of Patent: Mar. 15, 2022

(54) ELECTRONIC DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shoichi Shimizu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/797,980

(22) Filed: Feb. 21, 2020

(65) Prior Publication Data

US 2021/0089098 A1 Mar. 25, 2021

(30) Foreign Application Priority Data

Sep. 19, 2019 (JP) .............................. JP2019-170913

(51) Int. Cl.
  G06F 1/26 (2006.01)
  G06F 13/42 (2006.01)
  G11C 17/16 (2006.01)

(52) U.S. Cl.
  CPC .......... G06F 1/266 (2013.01); G06F 13/4282 (2013.01); G11C 17/16 (2013.01); *G06F 2213/0028* (2013.01)

(58) Field of Classification Search
  CPC . Y02D 10/00; G06F 13/4022; G06F 13/4282; G06F 3/06; G06F 1/3287;
  (Continued)

(56) References Cited

U.S. PATENT DOCUMENTS 7,750,694 B1 * 7/2010 Nguyen ................. H03K 17/22
 327/143
9,811,489 B2 11/2017 Suto
(Continued)

FOREIGN PATENT DOCUMENTS

JP H07281838 A 10/1995
JP 2018092564 A 6/2018

*Primary Examiner* — Faisal M Zaman
(74) *Attorney, Agent, or Firm* — Kim & Stewart LLP

(57) ABSTRACT

An electronic device includes an interface with a first terminal, a second terminal, and a power supply. A voltage divider includes series-connected resistors, between the first terminal and ground voltage. A first programmable fuse is provided and the voltage divider converts the first signal to a different voltage level according to the state of the first programmable fuse. A first transistor has a gate receiving the converted first signal and a second transistor has a gate electrically connected to the second terminal and a source-drain terminal of the first transistor. The second transistor is off when the first transistor is on. A fuse-type switching element is connected between the power supply terminal a power supply circuit. A control terminal of the fuse-type switching element is connected to a source-drain terminal of the second transistor switches conduction state according to whether the second transistor is on or off.

20 Claims, 4 Drawing Sheets

(58) Field of Classification Search
CPC ............ G06F 3/061; G06F 2213/0028; G06F 3/0655; G06F 3/0689; G06F 1/266; G06F 1/3268
USPC .................... 710/106, 74; 711/E12.001, 112; 713/300, 324
See application file for complete search history.

(56) References Cited

U.S. PATENT DOCUMENTS

| | | | |
|---|---|---|---|
| 9,946,329 B2 | 4/2018 | Shimizu et al. | |
| 10,216,425 B1* | 2/2019 | Gudipati | G06F 3/067 |
| 2004/0129952 A1* | 7/2004 | Griesmer | G11C 29/02 257/202 |
| 2007/0176630 A1* | 8/2007 | Snider | H03K 19/17748 326/38 |
| 2008/0002450 A1* | 1/2008 | Wissel | G11C 17/16 365/96 |
| 2009/0128189 A1* | 5/2009 | Madurawe | H03K 19/17796 326/41 |
| 2010/0325461 A1* | 12/2010 | Sakagami | G06F 1/3268 713/324 |
| 2012/0306048 A1* | 12/2012 | Li | G11C 17/16 257/529 |
| 2014/0075065 A1* | 3/2014 | Haeffner | G06F 3/0688 710/74 |
| 2014/0119140 A1* | 5/2014 | Seol | G11C 29/023 365/191 |
| 2014/0334049 A1* | 11/2014 | Singh | H01L 27/0248 361/91.5 |
| 2015/0370748 A1* | 12/2015 | Wakayama | G06F 13/4022 710/106 |
| 2016/0181801 A1* | 6/2016 | Shimizu | G06F 1/26 307/19 |
| 2016/0239458 A1* | 8/2016 | Varchavtchik | G06F 13/4022 |
| 2016/0267039 A1* | 9/2016 | Suto | G06F 13/4022 |
| 2016/0372913 A1* | 12/2016 | Aftabjahani | H01L 27/0251 |
| 2017/0293545 A1* | 10/2017 | Brooks | G06F 11/3089 |
| 2017/0308486 A1* | 10/2017 | Kotake | G06F 3/061 |
| 2018/0219641 A1* | 8/2018 | Tabor | H04L 47/623 |
| 2019/0303318 A1* | 10/2019 | Mao | G06F 13/4282 |

* cited by examiner

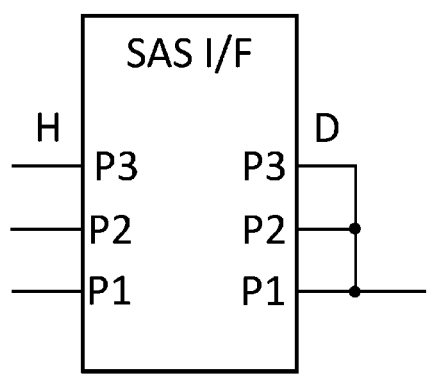
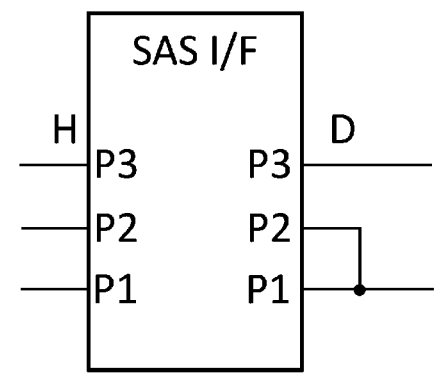
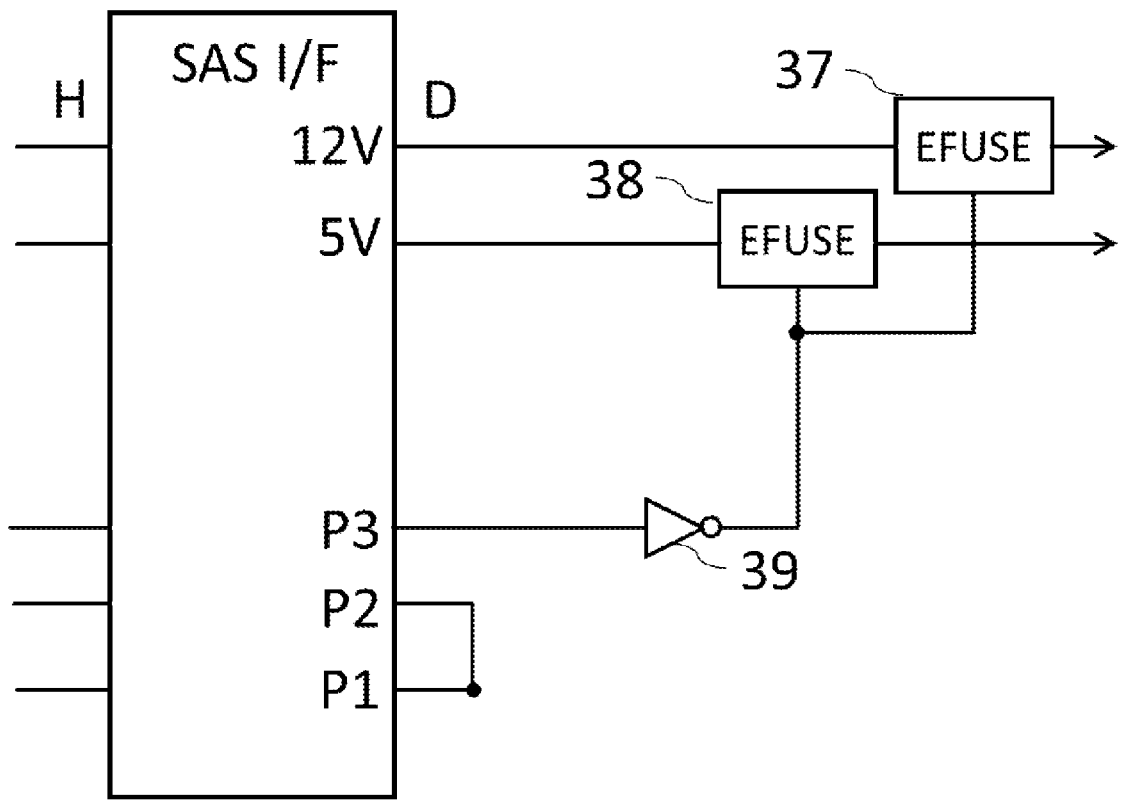

ELECTRONIC DEVICE

CROSS-REFERENCE TO RELATED APPLICATION(S)

This application is based upon and claims the benefit of priority from Japanese Patent Application No. 2019-170913, filed Sep. 19, 2019, the entire contents of which are incorporated herein by reference.

FIELD

Embodiments described herein relate generally to an electronic device.

BACKGROUND

Examples of electronic storage devices include a hard disk drive (HDD) and a solid state drive (SSD), which can be connected to a host (external device), such as a personal computer (PC) or the like. The SAS standard (serial attached small computer system interface (SCSI)) provides a standard for the interfaces between such storage devices and a PC. When an interface is upgraded from an older standard to a newer standard, some compatibility will be lost in the change from the old standard to the new standard. The new standard may not be fully supported by the old standard. That is, there may be a case where the storage device operating according to the new standard cannot be controlled by a host operating according to the old standard.

DESCRIPTION OF THE DRAWINGS

FIG. 1A shows an SAS-2 standard interface.
FIG. 1B shows an SAS-3 standard interface.
FIG. 1C is a block diagram showing an implementation example of a power disable function assigned to a P3 terminal under an SAS-3 standard.

DETAILED DESCRIPTION

Figure 2:
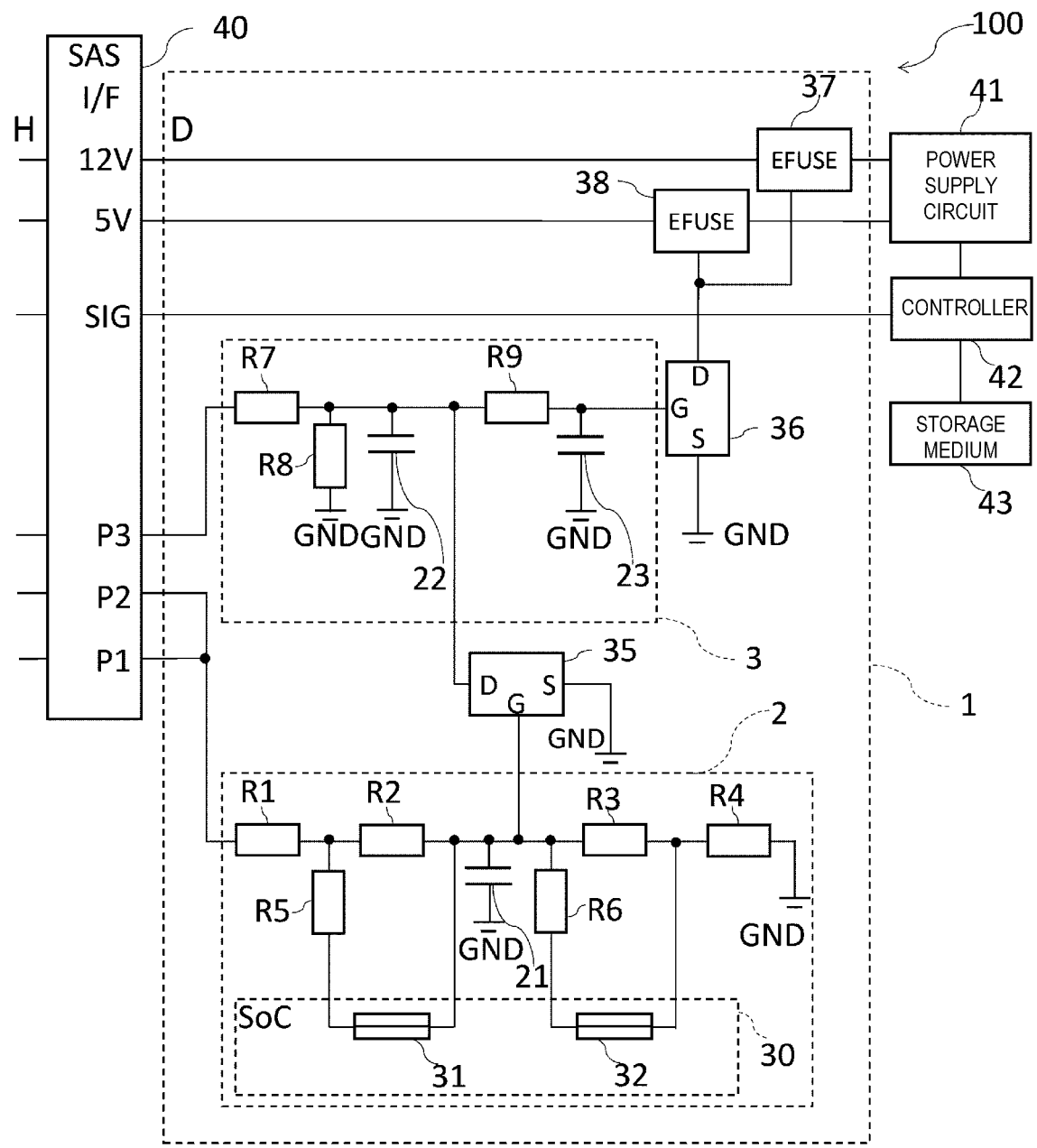
FIG. 2 is a block diagram showing an implementation example of a power disable circuit of an electronic device connectable to a host utilizing the SAS-2 standard according to a first embodiment.

In general, according to one embodiment, an electronic device includes an interface to be connected to an external device. The interface has a first terminal to receive a first signal, a second terminal to receive a second signal, and a power supply terminal to receive a power supply voltage. A first voltage divider includes a plurality of resistors that electrically connected in series between the first terminal and a reference voltage. A first programmable fuse in the first voltage divider has a first end connected to an end of the plurality of resistors. The first voltage divider is configured to convert the first signal to a different voltage level, which can be set according to a conduction state of the first programmable fuse, and output the converted first signal at a node between two adjacent resistors of the plurality resistors. A first transistor has a gate connected to the node and a first source-drain terminal electrically connected to the reference voltage. A second transistor has a gate electrically connected to the second terminal and a second source-drain terminal of the first transistor. The second transistor is configured to be off when the first transistor is on. A conduction control element, such as an electronic fuse or the like, has a first end electrically connected to the power supply terminal and a control terminal electrically connected to a source-drain terminal of the second transistor. The conduction control element is configured to be conductive or non-conductive according to a conduction state of the second transistor. A power supply circuit is connected to the power supply terminal via the conduction control element and is configured to generate a device power supply voltage when electrically connected to the power supply terminal.

First Embodiment

In this specification, the term "electrically connected" means that two or more elements are connected directly or indirectly, such as via a wire or another conductive element, and, in general, refers to a relationship between "electrically connected" elements in which the electrical state of one element correspondingly affects the electrical state of the connected element(s).

An electronic device 100 according to the present embodiment is a storage device. The case where the interface with the host utilizes an SAS-type interface will be described below. However, the present disclosure is not limited to the interfaces of storage devices, and may be applied to all electronic devices that require voltage control via the interface with the host.

First, an SAS standard will be described. Table 1 shows the difference in uses of terminals P1, P2 and P3 as power segments in the SAS-2 standard vs. the SAS-3 standard.

TABLE 1

| | SAS-2 | | SAS-3 | |
|---|---|---|---|---|
| | Definition of output terminal of host | Definition and processing of terminal on HDD side | Definition of output terminal of host | Definition and processing of terminal on HDD side |
| P1 | 3.3 V | 3.3 V Connect to P2/P3 | Vendor-specific specification | Not Used Connect to P2 |
| P2 | 3.3 V | 3.3 V Connect to P1/P3 | Vendor-specific specification | Not Used Connect to P1 |
| P3 | 3.3 V, precharge | 3.3 V connect to P1/P2 | Vendor-specific specification or PD signal | PD signal independent of P1/P2 |

FIG. 1A is an example of an SAS-2 standard interface. Each of terminals on an H side (host side) of the SAS interface in FIG. 1A is connected to the host, and each of terminals on a D side (device side) is connected to the electronic device (hereinafter, also more simply referred to as a device). In an SAS-2 standard, normally, when the host and the device are connected to each other, the terminals P1, P2, and P3 on the device side are connected to each other in common, and thus a power supply voltage of 3.3 V (or 0 V) is input to each. However, even in systems utilizing the SAS-2 standard, it is rare for a 2.5 inch/3.5 inch HDD to require a power supply input of 3.3 V, and thus in a system intended for use with a 2.5 inch/3.5 inch HDD, the P1, P2, and P3 terminals may be utilized according to vendor-specific specifications.

FIG. 1B is an example of an SAS-3 standard interface. In an SAS-3 standard, the P1 and P2 terminals on the device side are commonly connected. However, the P3 terminal is independent and may be used as a power disable terminal (hereinafter, referred to as a PD terminal). In addition, a manufacturer or designer of the host may also assign vendor-specific specifications to the P1 and P2 terminals, and may assign a power disable signal (hereinafter, referred to as a PD signal) or a vendor-specific specification to the P3 terminal. The voltages input/supplied to the P1 terminal, the P2 terminal, and the P3 terminal are referred to in this specification as a P1 voltage, a P2 voltage, and a P3 voltage.

In the SAS-3 standard, a power disable function (hereinafter, referred to as a PD function) that utilizes the P3 terminal for a power control signal of the device has been added. But this use of the P3 terminal in this manner is not supported in the SAS-2 standard. In this context, the PD function is the function permitting the device to turn the power supply input on/off based on the PD signal sent from the host to the P3 terminal. According to this, when a problem is caused by software of the device, the host can forcibly initialize (re-initialize) the device by turning on/off the power supply of the device, and then attempt to recover the device from the problem.

Next, Table 2 shows voltage specifications of the P3 terminal in the SAS-3 standard providing the PD function.

TABLE 2

|  | Unit | Minimum value | Maximum value |
|---|---|---|---|
| Input voltage range | [V] | −0.5 | 3.6 |
| Power supply of device is turned on | [V] | −0.5 | 0.7 |
| Power supply state of device is undefined | [V] | 0.7 | 2.1 |
| Power supply of device is turned off | [V] | 2.1 | 3.6 |

For these specifications, the minimum value is included (≤) in the range, while the maximum value is not included (>).

Hereinafter, a state in which a voltage of the PD signal (that is, P3 voltage) is less than 0.7 V will be referred to as a "Low" state, and a state in which the voltage is greater than or equal to 2.1 V will be referred to as a "High" state. Table 2 shows the following, when the PD signal (P3 voltage) is Low (less than 0.7 V), the power supply of the device is turned on. If the PD signal (P3 voltage) is High (greater than or equal to 2.1 V), the power supply of the device is turned off. On the other hand, when the PD signal (P3 voltage) is neither Low nor High (that is, 0.7 V≤P3 voltage<2.1 V), it is not determined whether or not the device is turned on or off, and the power supply state is undefined.

FIG. 1C is a block diagram showing an implementation example of the power disable function assigned to the P3 terminal in the SAS-3 standard. Power supply voltages of +12 V and +5 V supplied from the host are respectively supplied to a power supply circuit of the device via electronic fuses (EFUSEs) 37 and 38. The PD signal (P3 voltage) is supplied to control terminals of EFUSEs 37 and 38 via an inverter 39. However, when the PD signal (P3 voltage) is High (and thus inverted PD signal is Low), the EFUSEs 37 and 38 are disconnected (opened), and thus the power supply voltages of +12 V and +5 V are not supplied to the power supply circuit. When the P3 terminal is Low (and thus inverted PD signal is High), the EFUSEs 37 and 38 are connected (closed), and the power supply voltages of +12 V and +5 V are supplied to the power supply circuit. In this possible example, in a system in which 3.3 V is supplied to the P3 terminal, as in an old SAS-2 standard, since the PD signal assigned to the P3 terminal is considered High, a device using this SAS-3 standard will not powered on and cannot be started/operated.

In this way, under the SAS-3 standard, the device cannot be started unless the P3 terminal is Low (less than 0.7 V). Therefore, such a device using the SAS-3 standard is not compatible with the system to which the old SAS-2 standard is still being applied. Thus, it would appear it is necessary to design, manufacture, and sell devices separately for each standard according whether the device will be a product corresponding to the SAS-2 standard or the SAS-3 standard. However, if a device using the SAS-3 standard was compatible with a system conforming to the SAS-2 standard, it would not be necessary to design, manufacture, and sell devices separately for each standard. Therefore, the overall costs can be consolidated and lower cost can be achieved.

For example, when a system conforms to the SAS-2 standard, a device with the SAS-3 standard could operate a field effect transistor (FET) based on the voltage at the P1/P2 terminal to disable the PD function, and can thus receive the power supply from a host with the SAS-2 standard regardless of the input of the P3 terminal. However, when such a device is connected to a host using a SAS-2 standard having a vendor-specific specification or a host using a SAS-3 standard having a vendor-specific specification, then some voltage having a vendor-specific level or purpose (vendor setting voltage) is input to the P1/P2 terminal, so that the on/off switching operation of the FET may be uncertain or unstable. In this case, the device with a FET switch will not necessarily disable the PD function and might not be started by the system conforming to the SAS-2 standard but having a vendor-specific specification. Likewise, the device with a FET switch may not be able to use the PD function in the system conforming to the SAS-3 standard.

FIG. 2 is a block diagram showing an implementation example of a power disable (PD) circuit 1 of the electronic device 100 connectable to a host with the SAS-2 standard according to the first embodiment. In the SAS-2 standard system, the PD circuit 1 according to the first embodiment may be supplied with the power supply voltages of +12 V and +5 V by disabling the PD function based on the voltage at the P1/P2 terminal. Further, the PD circuit 1 may avoid the problem of the operation of a FET becoming unstable/uncertain by adjusting a voltage level applied from the P1/P2 terminal to the FET by voltage division using a plurality of resistors and a one-time programmable fuse (hereinafter, referred to as an OTPF).

Strictly speaking, voltage is a voltage difference between different nodes. However, in this specification, for convenience of explanation, "voltage" at a node or a terminal is expressed as the voltage of the node or the terminal with respect to a GND voltage.

FIG. 2 shows that an SAS-3 standard interface 40 between the host (H) and the electronic device 100 includes power supply terminals of +12 V and +5 V, the P1, P2, and P3 terminals, and a signal terminal SIG (each of the power supply terminals and the signal terminal are shown as singular, but in reality, there may be a plurality of such terminals).

In addition to these terminals, other various terminals such as a ground terminal are included. The power supply voltages of +12 V and +5 V from the host are respectively supplied to a power supply circuit 41 via the EFUSEs 37 and 38. The power supply circuit 41 includes a DC/DC converter and the like, generates a predetermined operating voltage from +12 V and +5 V, and supplies the operating voltage to circuits of the electronic device 100 including a controller 42. The controller 42 controls writing of data to a storage medium 43, such as a hard disk and/or a flash memory, and reading of data from the storage medium 43. Control signals or read/write commands from the host are sent to the controller 42 via the signal terminal SIG of the SAS interface. The P1 terminal is connected to the P2 terminal.

The PD circuit 1 includes the EFUSEs 37 and 38, a first voltage dividing unit 2, a second voltage dividing unit 3, a first FET 35, and a second FET 36. The PD circuit 1 is provided between the P1/P2 terminal and the P3 terminal on the host side and the power supply circuit 41 on the device side. The PD circuit 1 enables or disables the PD function based on the supplied P1/P2 terminal voltage. When the PD function is enabled, the PD circuit 1 controls the power supply to the electronic device 100 based on the PD signal supplied from the host via the P3 terminal.

The first voltage dividing unit 2 includes a resistor R1, a resistor R2, a resistor R3, a resistor R4, a resistor R5, a resistor R6, a capacitor 21, a first OTPF 31, and a second OTPF 32. The first voltage dividing unit 2 converts the P1/P2 voltage to a different voltage level by resistance division (voltage dividing) according to a write state of each OTPF. The converted P1/P2 voltage (an adjusted voltage level) is input to a gate of the first FET 35.

The first OTPF 31 and the second OTPF 32 are one-time programmable fuses. Each OTPF has two ends. The state between one end and the other end of the OTPF is normally a connected state, but once programmed (written), the state becomes disconnected state and cannot be returned to the connected state. The each OTPF is provided on a system-on-chip (SoC) 30, and for example, may be programmed by firmware in the electronic device 100.

The resistor R1, the resistor R2, the resistor R3, and the resistor R4 are electrically connected in series between the P1/P2 (common) terminal and the reference voltage GND. The resistor R5 is electrically connected in series with the first OTPF 31. The resistor R5 and the first OTPF 31 are together electrically connected in parallel with the resistor R2. The resistor R6 is electrically connected in series with the second OTPF 32. The resistor R6 and the second OTPF 32 are together electrically connected in parallel with the resistor R3. A node between the resistor R2 and the resistor R3 is electrically connected to the gate of the first FET 35. The capacitor 21 has one end electrically connected to a node between the resistor R2 and the resistor R3, and the other end electrically connected to the reference voltage GND.

The second voltage dividing unit 3 includes a resistor R7, a resistor R8, a resistor R9, a capacitor 22, and a capacitor 23. The second voltage dividing unit 3 converts the P3 voltage (PD signal) to a different voltage level according to resistance-voltage division, and outputs the adjusted/converted P3 voltage to a gate of the second FET 36. The resistor R7 and the resistor R8 are electrically connected in series between the P3 terminal and the reference voltage GND. The resistor R9 has one end electrically connected to a node between the resistor R7 and the resistor R8, and the other end electrically connected to the gate of the second FET 36. The capacitor 22 has one end electrically connected to a node between the resistor R7 and the resistor R8, and the other end electrically connected to the reference voltage GND. The capacitor 23 has one end electrically connected to a node between the resistor R9 and the gate of the second FET 36, and the other end electrically connected to the reference voltage GND.

The capacitors 21, 22, 23 and resistors R1, R2, R7, R9 function together as low-pass filters.

The first FET 35 and the second FET 36 are, for example, N-type MOSFETs. For the first FET 35 and the second FET 36, when a voltage equal to or greater than Von is input to the gates, the source and the drain are connected electrically with each other. For the first FET 35 and the second FET 36, when a voltage equal to or less than Voff is input to the gates, the source and the drain become disconnected electrically from each other. For the first FET 35 and the second FET 36, when a voltage less than Von but greater than Voff is input to the gates, conduction between the source and the drain is variable/indefinite, so that the source and the drain may be considered partially connected/disconnected in a manner not easy to control. Since it is necessary to determine whether the power supply (3.3 V or 0 V) for a normal SAS-2 standard is being input to the P1/P2 terminal and to control the PD function appropriately, MOSFETs with Von<3.3 V and 0<Voff can be used for the first FET 35 and the second FET 36.

The source of the first FET 35 is electrically connected to the reference voltage GND. The drain of the first FET 35 is electrically connected to a node between the resistor R7 and the resistor R9.

The source of the second FET 36 is electrically connected to the reference voltage GND. The drain of the second FET 36 is electrically connected to control terminals of the EFUSEs 37 and 38. A gate voltage of the second FET 36 is determined by the P3 voltage (PD signal) as converted to a different voltage level by the resistance-voltage division of the second voltage dividing unit 3 and an operation of the first FET 35.

When the first FET 35 is turned on, the gate of the second FET 36 is supplied with the reference voltage (0 V), and is thus turned off regardless of the value of the P3 voltage being supplied at the P3 terminal. Thus, the PD function is disabled when the first FET 35 is on. When the first FET 35 is turned off, the second FET 36 is controlled according to the value of the P3 voltage. Thus the PD function of the PD circuit 1 is enabled when the first FET 35 is off.

When the second FET 36 is turned off, the control terminals of the EFUSEs 37 and 38 and the reference voltage GND are not connected to each other. The EFUSEs 37 and 38 are closed (conductive) when a High level voltage is input to the control terminals thereof. When this occurs, the EFUSEs 37 and 38 function to supply the power supply voltages of +12 V and +5 V to the power supply circuit 41.

When the second FET 36 is turned on, the control terminals of the EFUSEs 37 and 38 and the reference voltage GND are connected to each other. The EFUSEs 37 and 38 are opened when a Low level voltage is input to the control terminals thereof. At this time, the EFUSEs 37 and 38 function to stop supply of the power supply voltages of +12 V and +5 V to the power supply circuit 41.

Here, a relationship between a state of the power supply to the P1/P2 voltage, the P3 voltage level, and the power supply circuit 41 and a connection state of each OTPF 31/32 will be described.

Resistance values for the resistors R1 to R9 are expressed as $r_1$ to $r_9$. The resistance value of a resistor combination is represented by "r" along with subscripts for each index number of the resistors in the combination. For example, the combined resistance value of the resistors R1, R2, and R5 is represented by $r_{1,\,2,\,5}$. The resistance values of any resistor described later is also expressed similarly. Table 3 shows an example of Von, Voff, and the resistance values of the resistors. For better understanding, values for Von, Voff, and the resistance values of the resistors used as a non-limiting example in this specification will the values listed in Table 3.

TABLE 3

| Resistance value (kΩ) | | Resistance value (kΩ) | | Voltage (V) | |
|---|---|---|---|---|---|
| $r_1$ | 5 | $r_8$ | 300 | Von | 2.1 |
| $r_2$ | 10 | $r_9$ | 20 | Voff | 0.7 |
| $r_3$ | 300 | $r_{10}$ | 10 | | |
| $r_4$ | 150 | $r_{11}$ | 300 | | |
| $r_5$ | 10 | $r_{1, 2, 5}$ | 10 | | |
| $r_6$ | 300 | $r_{3, 4, 6}$ | 300 | | |
| $r_7$ | 10 | $r_{1, 2}$ | 15 | | |
| | | $r_{3, 4}$ | 450 | | |

The following description will be given on the assumption that the first OTPF 31 and the second OTPF 32 are not yet programmed (written), that is, not yet disconnected, unless specifically indicated otherwise.

(1) When voltage equal to or more than Von is applied to gate of first FET 35

The first FET 35 is turned on, and a node between the resistor R7 and the resistor R9 is grounded. Regardless of the input of the P3 terminal, the gate voltage of the second FET 36 is at 0 V, and the second FET 36 is thus turned off. The EFUSEs 37 and 38 only conduct (between SAS I/F 40 and power supply circuit 41) when a High level voltage is input to the control terminals thereof. Note, each EFUSES 37 and 38 in this instance respectively incorporates a pull-up resistor connected between the control terminal thereof and the power supply voltages. Thus, unless the control terminals of the EFUSES 37 and 38 are connected to reference voltage GND via the second FET 36, each will be conductive assuming the power supply voltages are active/on. That is, the power supply circuit 41 will be supplied with the power supply voltages of +12 V and +5 V when the EFUSEs 37 and 38 are conductive. The supply of the power supply voltages of +12 V and +5 V to the power supply circuit 41 regardless of the input of the P3 terminal is referred to as disablement of the PD function.

When the electronic device 100 is connected to a host using the SAS-2 standard, a voltage of 3.3 V is applied to the P1/P2/P3 terminal, thus $3.3\ V \times r_{3, 4, 6}/(r_{1, 2, 5} + r_{3, 4, 6}) \approx 3.19$ V, which is greater than Von (Von=2.1 V, see Table 3). That is, when the electronic device 100 is connected to the host with the SAS-2 standard, the electronic device 100 disables the PD function and is supplied with the power supply voltages of +12 V and +5 V.

When the electronic device 100 is connected to a host using the SAS-3 standard, a voltage at any level may be applied to the P1/P2 terminal and thus to the gate of the first FET 35. When the electronic device 100 is connected to the host with the SAS-3 standard in which a voltage equal to or greater than Von is input to the gate of the first FET 35, the PD function is disabled. The electronic device 100 thus cannot control the supply of the power supply voltages of +12 V and +5 V to the power supply circuit 41 using a PD signal input at the P3 terminal. However, the power supply circuit 41 is still always supplied with the power supply voltages of +12V and +5V, and the electronic device 100 is at least operable.

(2) When voltage less than Voff is applied to gate of first FET 35

The first FET 35 is turned off, and the supply of the power supply voltages of +12 V and +5 V to the power supply circuit 41 is controlled according to the P3 voltage (the PD function is enabled).

When the PD function is enabled and the PD signal (P3 voltage) is Low, the second FET 36 is turned off (and thus control terminals of the EFUSEs 37 and 38 are not grounded). When the High level voltage is input to the control terminals of the EFUSEs 37 and 38 rather than the reference voltage GND, the EFUSEs 37 and 38 are conductive. Accordingly, the power supply of +12 V and +5 V is supplied to the power supply circuit 41.

When the PD function is enabled and the PD signal input to the P3 terminal is High, the second FET 36 is turned on by a PD signal whose voltage has been adjusted by the resistance-voltage division (of first voltage dividing unit 2). The EFUSEs 37 and 38 are non-conductive when Low level voltage is input to the control terminals thereof. Accordingly, the supply of the power supply voltages of +12 V and +5 V to the power supply circuit 41 is shut down.

There is a possibility that a PD signal at a voltage level at which the conductive state of the second FET 36 is undefined could be input to the P3 terminal of the electronic device 100.

But when the electronic device 100 is connected to the host with the SAS-3 standard a voltage equal to or greater than Von will be input to the gate of the first FET 35, so the electronic device 100 may operate by normally using the PD function.

(3) When voltage equal to or greater than Voff but less than Von is applied to gate of first FET 35, the first FET 35 is in an indefinite state.

The first FET 35 can be turned on or off by a P1/P2 voltage according to the vendor setting voltage, and it is thus conceivable that the PD circuit 1 may be in a PD function state (enabled or disabled) that is not intended by a user. However, in this embodiment, the voltage supplied to the gate of the first FET 35 may be adjusted and the on/off operation of the first FET 35 may be reversed by writing the first OTPF 31 or the second OTPF 32. When the on/off operation of the first FET 35 can be reversed, there is a possibility that the PD circuit 1 can match the PD function state that is intended by the user.

For example, a connection between the electronic device 100 and the host having a P1/P2 voltage of 1.8 V, which is between Von and Voff, is considered. When the first OTPF 31 and the second OTPF 32 are not yet written, $1.8\ V \times r_{3, 4, 6}/(r_{1, 2, 5} + r_{3, 4, 6}) \approx 1.74$ V is input to the first FET 35.

At this time, if the PD function is being disabled against the intention of the user, the first OTPF 31 can be written (opened). The resistor R5 will no longer be involved in the resistance-voltage division, and the voltage input to the gate of the first FET 35 is reduced to $1.8\ V \times r_{3, 4, 6}/(r_{1, 2} + r_{3, 4, 6}) \approx 1.71$ V. There is a possibility that the first FET 35 may now be switched from on to off and the PD function may be enabled after the voltage input to the gate of the first FET 35 is reduced.

For example, in the system with the SAS-3 standard, when the P1/P2 voltage is high, the PD function is disabled. At this time, there is a possibility that the PD function may still be used by writing the first OTPF 31.

Further, when 1.8 V is input to the P1/P2 terminal and the PD function is being enabled against the intention of the user, the second OTPF 32 can be written (opened). The resistor R6 will no longer be involved in the resistance-voltage division, and the voltage input to the gate of the first FET 35 increases to $1.8 \times r_{3,4}/(r_{1,2,5}+r_{3,4}) \approx 1.76$ V. There is a possibility that the first FET 35 may now be switched from off to on and the PD function may be disabled when the voltage input to the gate of the first FET 35 increases.

In a system with the SAS-2 standard that uses the P1, P2, and P3 terminals in specific purposes, the PD function is enabled when the P1/P2 voltage is low and the P3 voltage is high. In such a system, since the second FET 36 is turned on, the power supply voltages of +12 V and +5 V are not supplied to the power supply circuit 41. However, there is a possibility that the first FET 35 may be switched from off to on and the PD function that is presently enabled may be disabled by writing the second OTPF 32. In the system with the SAS-2, there is a high probability that the power supply voltages of +12 V and +5 V may be supplied to the electronic device 100.

The voltage input to the gate of the first FET 35 may be adjusted by writing both the first OTPF 31 and the second OTPF 32. The voltage input to the gate of the first FET 35 when both the first OTPF 31 and the second OTPF 32 have been written may be larger or smaller than the voltage input to the gate of the first FET 35 if neither the first OTPF 31 nor the second OTPF 32 has been written, though this depends on the resistance values of the resistors involved.

Figure 3:
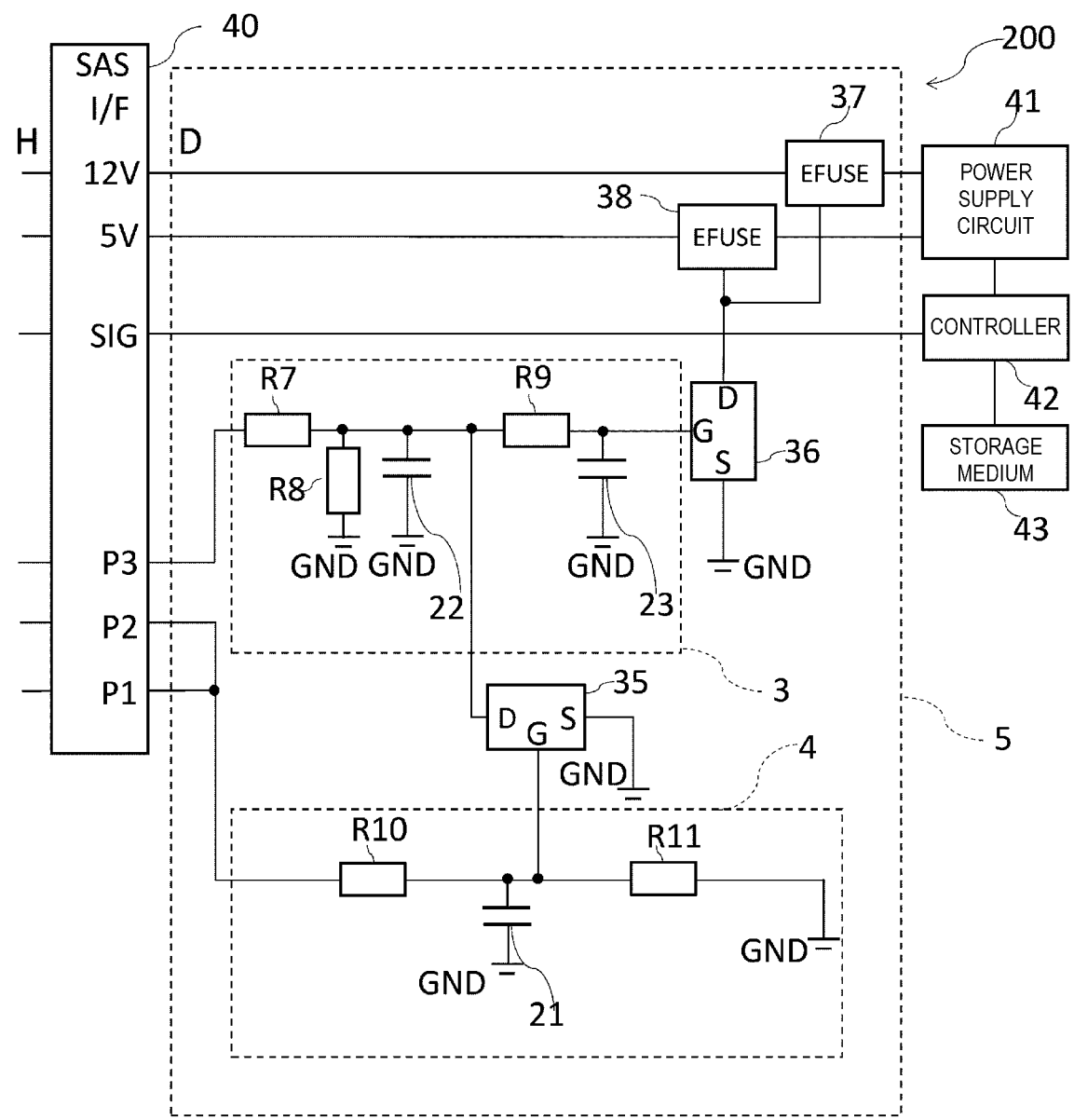
FIG. 3 is a block diagram showing an implementation example of a power disable circuit of an electronic device connectable to a host utilizing the SAS-2 standard according to a comparative example.

FIG. 3 is a block diagram in which a PD circuit 5 of a comparative example is mounted on an electronic device 200. The PD circuit 5 of the comparative example is different from the PD circuit 1 in in the inclusion of the first voltage dividing unit 2. The electronic device 200 is a SAS-3 standard compatible storage device in a system to which the SAS-2 standard is applied.

A first voltage dividing unit 4 of the comparative example includes a resistor R10, a resistor R11, and the capacitor 21. The resistor R10 has one end electrically connected to the P1/P2 terminal and the other end electrically connected to the gate of the first FET 35. The resistor R11 has one end electrically connected to the other end of the resistor R10, and has the other end electrically connected to the reference voltage GND. The capacitor 21 has one end electrically connected to the other end of the resistor R10, and has the other end electrically connected to the reference voltage GND.

The voltage levels of the P1/P2 voltage and the P3 voltage and an operation of the PD circuit 5 of the comparative example will be described.

The description will be made assuming that a resistance value $r_{10}$ of the resistor $R10 = r_{1,2,5}$ and a resistance value $r_{11}$ of the resistor $R11 = r_{2,4,6}$. That is, in the first voltage dividing unit 4, the resistance-voltage division is the same as that of a first voltage dividing unit 2 in which the first OTPF 31 and the second OTPF 32 are not written.

The first voltage dividing unit 4 converts the P1/P2 voltage to a different voltage level according to the resistance-voltage division. The converted P1/P2 voltage is input to the gate of the first FET 35. When a voltage less than Voff or a voltage equal to or greater than Von is applied to the gate of the first FET 35, the PD circuit 5 of the comparative example performs the same operation as the PD circuit 1 of the first embodiment in which the first OTPF 31 and the second OTPF 32 have not been written. That is, the electronic device 100 may supply power to the power supply circuit 41 by the PD circuit 5 in the system with the normal SAS-2 standard.

But when a voltage equal to or greater than Voff but less than Von is input to the gate of the first FET 35, the on/off state of the first FET 35 is indefinite. Accordingly, the PD circuit 5 may enter a PD function state (enabled/disabled) that is not intended by the user. In the comparative example, the input voltage of the gate of the first FET 35 can only be one value determined according to the P1/P2 voltage as supplied.

In the comparative example, when the electronic device 200 enters a PD function enabled/disabled state that is not intended by the user, it is necessary to change a voltage specification of the host or manually change the resistance values of the resistor R10 and the resistor R11 of the first voltage dividing unit 4 in order to reverse the unintended PD function enabled/disabled state.

However, it is usually difficult to change the voltage specification of the host according to the state of the electronic device 200. In addition, a change of a design of the first voltage dividing unit 4 according to a vendor environment is not preferable for device manufacturing because additional costs are added to normal costs of design, development, and manufacturing.

On the other hand, when the electronic device 100 according to the present embodiment enters a PD function enabled/disabled state that is not intended by the user, the operation of the first FET 35 may be reversed to match the operation state (PD function enabled/disabled state) that is intended by the user by writing the first OTPF 31 and/or the second OTPF 32. A design change is not necessary for writing the first OTPF 31 and the second OTPF 32, and when the PD circuit 1 enters the PD function enabled/disabled state that is not intended by the user, the required cost for dealing with the above situation would be reduced.

In addition, when the first OTPF 31 and the second OTPF 32 are not written, the PD circuit 1 can still perform resistance division similar to the PD circuit 5 of the comparative example. Therefore, in the electronic device 100, the PD circuit 5 may be replaced with the PD circuit 1, and a system with the SAS-2 standard and the SAS-3 standard having a specification corresponding to the electronic device 200 of the comparative example can be increased.

Figure 4:
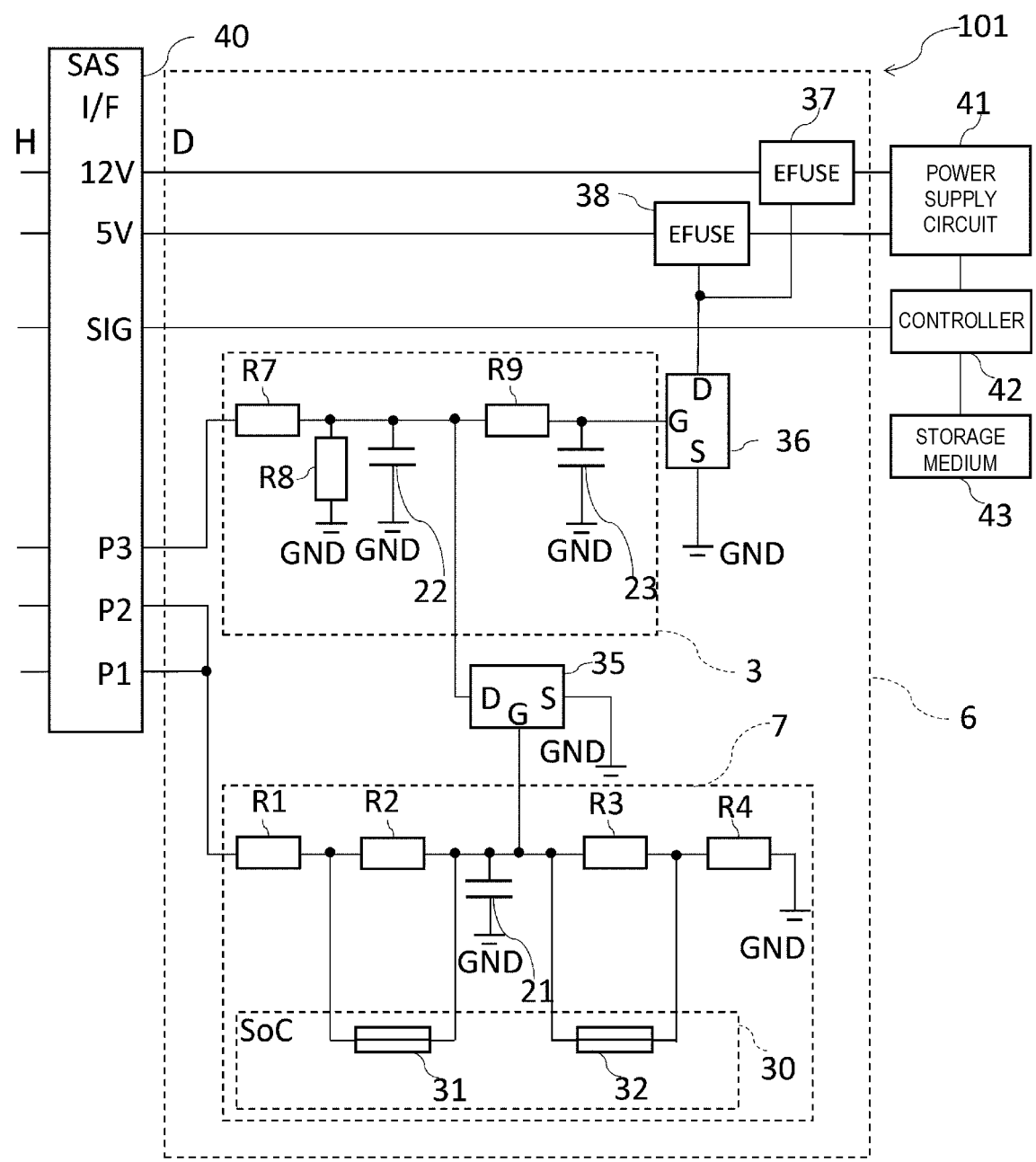
FIG. 4 is a block diagram showing an implementation example of a power disable circuit of an electronic device connectable to a host utilizing the SAS-2 standard according to a second embodiment.

FIG. 4 is a block diagram depicting a PD circuit 6 mounted in an electronic device 101 according to a modification of the first embodiment. A first voltage dividing unit 7 of the PD circuit 6 is different from the first voltage dividing unit 2 of the first embodiment in that the resistors R5 and R6 are not provided.

In the first embodiment, the first OTPF 31 is electrically connected in parallel to the resistor R2. The second OTPF 32 is electrically connected in parallel to the resistor R3.

In the modification of the first embodiment, when the first OTPF 31 and the second OTPF are not yet written, the P1/P2 voltage is divided by the resistors R1 and R4. For example, when the P1/P2 voltage is 1.8 V, $1.8 \text{ V} \times r_4/(r_1+r_4) \approx 1.74$ V is input to the gate of the first FET 35.

When the first OTPF 31 is written, the P1/P2 voltage is divided by the resistors R1, R2, and R4. $1.8 \text{ V} \times r_4/(r_{1,2}+r_4) \approx 1.64$ V is input to the gate of the first FET 35. Thus, after the first OTPF 31 is written, the voltage input to the gate of the first FET 35 is reduced.

After the second OTPF 32 is written, the P1/P2 voltage is divided by the resistors R1, R3, and R4. $1.8 \text{ V} \times r_{3,4}/(r_1+r_{3,4}) \approx 1.78$ V is input to the gate of the first FET 35. Thus, after the second OTPF 32 is written, the voltage input to the gate of the first FET 35 can be increased.

In this way, the PD circuit 6 of the modification, like the PD circuit 1, can reverse the operation of the first FET to match the intended operation state (PD function enabled/disabled state) intended by the user by writing the first OTPF 31 and/or the second OTPF 32.

As described above, the electronic device with the SAS-3 standard shown in the first embodiment and the modification includes a PD circuit. The PD circuit includes a first voltage dividing unit 2, a second voltage dividing unit 3, a first FET 35, a second FET 36, and EFUSEs 37 and 38. The first voltage dividing unit includes resistors electrically connected between the P1/P2 terminal and the reference voltage GND and OTPFs, and converts the P1/P2 voltage to the different voltage level according to the state of the OTPF and outputs the converted P1/P2 voltage to the gate of the first transistor 35. The first FET 35 operates (switches on/off) according to the input to the gate, and thus switches the PD function from enabled to disabled or vice versa. The second FET 36 is turned off regardless of the P3 voltage when the first FET 35 is turned on. The second FET 36 is also turned off when the first FET 35 is turned off and the P3 voltage is Low. The second FET 36 is turned on when the first FET 35 is turned off and the P3 voltage is High. The EFUSEs 37 and 38 operate to supply power to the power supply circuit 41 when the second FET 36 is turned off and to shut down the power supply to the power supply circuit 41 when the second FET 36 is turned on.

When a voltage having a vendor-specific value is input to the P1/P2 terminal and this voltage value is at a level which causes the on/off state of the first FET 35 to be is indefinite when input to the gate of the first FET 35, a PD circuit may be in a PD function enabled/disabled state that is not intended by the user. However, according to the present embodiment, there is a possibility that the switching state of the first FET 35 may be reversed to match the intended PD function enabled/disabled state by writing the first OTPF 31 and/or the second OTPF 32 to account for the vendor-specific voltage value input to the P1/P2 terminal.

An electronic device according to the first embodiment and the modification enables or disables the PD function based on the P1/P2 voltage, so that the electronic device is compatible with a normal older standard (SAS-2 standard) system, a new standard (SAS-3 standard) system including the power disable function, and a system with old and new standards having vendor-specific specifications.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An electronic device, comprising:
   an interface to be connected to an external device and including a first signal terminal to receive a first signal, a second signal terminal to receive a second signal, and a power supply terminal to receive a power supply voltage;
   a first voltage divider that includes a plurality of resistors, electrically connected in series between the first signal terminal and a reference voltage, and a first programmable fuse having a first end connected to an end of the plurality of resistors, the first voltage divider configured to convert the first signal to a different voltage level which is set according to a conduction state of the first programmable fuse and output the converted first signal at a node between two adjacent resistors of the plurality resistors;
   a first transistor having a gate connected to the node and a first terminal electrically connected to the reference voltage;
   a second transistor having a gate electrically connected to the second signal terminal and a second terminal of the first transistor, the second transistor configured to be off when the first transistor is on;
   a conduction control element that includes a first end electrically connected to the power supply terminal and a control terminal electrically connected to a terminal of the second transistor, the conduction control element configured to be conductive or non-conductive according to a conduction state of the second transistor; and
   a power supply circuit that is connected to the power supply terminal via the conduction control element and configured to generate a device power supply voltage when electrically connected to the power supply terminal.

2. The electronic device according to claim 1, wherein the first voltage divider further includes a second programmable fuse,
   the first programmable fuse is connected between the first signal terminal and the node, and
   the second programmable fuse is connected between the node and the reference voltage.

3. The electronic device according to claim 2, wherein the first voltage divider further includes:
   a first resistor electrically connected in series with the first programmable fuse between at least one resistor of the plurality of resistors and the node.

4. The electronic device according to claim 3, wherein the first voltage divider further includes:
   a second resistor electrically connected in series with the second programmable fuse between the node and the reference voltage.

5. The electronic device according to claim 2, wherein the first voltage divider further includes:
   a first resistor electrically connected in series with the second programmable fuse between the node and at least one resistor of the plurality of resistors.

6. The electronic device according to claim 2, wherein the second programmable fuse is connected in parallel with at least one of the resistors of the plurality of resistors.

7. The electronic device according to claim 1, wherein the first voltage divider further includes:
   a first resistor electrically connected in series with the first programmable fuse between at least one resistor of the plurality of resistors and the node.

8. The electronic device according to claim 1, wherein the first programmable fuse is connected in parallel with at least one of the resistors of the plurality of resistors.

9. The electronic device according to claim 1, wherein the first programmable fuse is on a system-on-chip.

10. The electronic device according to claim 1, wherein the conduction control element is an electronic fuse.

11. The electronic device according to claim 1, wherein the external device is a SAS-2 standard device.

12. The electronic device according to claim 1, wherein the external device is a SAS-3 standard device.

13. An electronic system apparatus, comprising:
   an interface to be connected to an external device and including a first signal terminal to receive a first signal, a second signal terminal to receive a second signal, and a power supply terminal to receive a power supply voltage;

a first resistor and a second resistor connected in series between the first signal terminal and a first node;

a first programmable fuse connected in parallel with the second resistor between the first resistor and the first node;

a third resistor and a fourth resistor connected in series between the node and a reference voltage;

a first transistor having a gate connected to the node and a first terminal electrically connected to the reference voltage;

a second transistor having a gate electrically connected to the second signal terminal and a second terminal of the first transistor, the second transistor configured to be off when the first transistor is on;

an electronic fuse having a first end electrically connected to the power supply terminal and a control terminal electrically connected to a terminal of the second transistor, the electronic fuse configured to be conductive or non-conductive according to a conduction state of the second transistor; and a power supply circuit that is connected to the power supply terminal via the electronic fuse and configured to generate a device power supply voltage when electrically connected to the power supply terminal.

14. The electronic system apparatus according to claim 13, further comprising:

a second programmable fuse connected in parallel with the third resistor between the node and the fourth resistor.

15. The electronic system apparatus according to claim 14, wherein the first and second programmable fuses are one-time programmable fuses on a system-on-chip substrate.

16. The electronic system apparatus according to claim 13, further comprising:

a controller connected to the power supply circuit; and
a storage device connected to the controller.

17. The electronic system apparatus according to claim 13, further comprising:

a capacitor connected between the node and the reference voltage.

18. The electronic system apparatus according to claim 13, wherein the second signal terminal is a P3 terminal of a SAS-type interface and the first signal terminal is at least one of a P1 and P2 terminal of the SAS-type interface.

19. An electronic system apparatus, comprising:

a host device operating according to a SAS-2 or a SAS-3 standard;

an electronic device including:
a SAS-type interface connected to the host device and including a first signal terminal to receive a first signal, a second signal terminal to receive a second signal, and a power supply terminal to receive a power supply voltage from the host device;

a first resistor and a second resistor connected in series between the first signal terminal and a first node;

a first programmable fuse connected in parallel with the second resistor between the first resistor and the first node;

a third resistor and a fourth resistor connected in series between the node and a reference voltage;

a first transistor having a gate connected to the node and a first terminal electrically connected to the reference voltage;

a second transistor having a gate electrically connected to the second signal terminal and a second terminal of the first transistor, the second transistor configured to be off when the first transistor is on;

an electronic fuse having a first end electrically connected to the power supply terminal and a control terminal electrically connected to a terminal of the second transistor, the electronic fuse configured to be conductive or non-conductive according to a conduction state of the second transistor; and a power supply circuit that is connected to the power supply terminal via the electronic fuse and configured to generate a device power supply voltage when electrically connected to the power supply terminal, wherein the first programmable fuse is settable by firmware of the electronic device to adjust a voltage supplied to the gate of the first transistor to permit operation of the electronic device with the host device.

20. The electronic system apparatus according to claim 19, further comprising:

a second programmable fuse connected in parallel with the third resistor between the node and the fourth resistor.

* * * * *